(12) United States Patent
Min

(10) Patent No.: US 11,963,319 B2
(45) Date of Patent: Apr. 16, 2024

(54) DISPLAY DEVICE

(71) Applicant: Samsung Display Co., Ltd., Yongin-si (KR)

(72) Inventor: Myungan Min, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 24 days.

(21) Appl. No.: 17/683,907

(22) Filed: Mar. 1, 2022

(65) Prior Publication Data

US 2022/0394868 A1 Dec. 8, 2022

(30) Foreign Application Priority Data

Jun. 7, 2021 (KR) .................. 10-2021-0073726

(51) Int. Cl.
  *H05K 5/00* (2006.01)
  *H05K 5/02* (2006.01)
(52) U.S. Cl.
  CPC ......... *H05K 5/0217* (2013.01); *H05K 5/0017* (2013.01)
(58) Field of Classification Search
  CPC ...................... H05K 5/0017; H05K 5/0217
  USPC ................... 361/807, 728, 809, 810
  See application file for complete search history.

(56) References Cited

U.S. PATENT DOCUMENTS

| 10,121,988 B2 | 11/2018 | Oh et al. |
| 10,903,445 B2 | 1/2021 | Baek et al. |
| 10,963,014 B1* | 3/2021 | Park ................. H04B 1/3827 |
| 2018/0192527 A1* | 7/2018 | Yun .................... G09F 9/301 |
| 2020/0348727 A1* | 11/2020 | Lee .................. G06F 1/1624 |
| 2022/0240399 A1* | 7/2022 | Dong ................ G06F 1/1652 |
| 2022/0255023 A1* | 8/2022 | Cai .................. H10K 50/86 |

FOREIGN PATENT DOCUMENTS

| KR | 10-2014-0101124 | 8/2014 |
| KR | 10-2017-0065058 | 6/2017 |
| KR | 10-2019-0112535 | 10/2019 |

* cited by examiner

*Primary Examiner* — Hung S. Bui
(74) *Attorney, Agent, or Firm* — KILE PARK REED & HOUTTEMAN PLLC

(57) ABSTRACT

Disclosed is a display device comprising a display panel, and a support layer disposed under the display panel. The display panel includes a display area that displays an image in a bending area and in a non-bending area, and a non-display area disposed adjacent to the display area in the bending area and the non-bending area. The display device is bend in the bending area during a sliding motion and not bent in the non-bending area adjacent to the bending area during the sliding motion. The non-display area that is disposed the bending area includes pattern areas and non-pattern areas adjacent to the pattern areas. Each of the pattern areas includes a concave portion and a remaining portion.

12 Claims, 12 Drawing Sheets

DISPLAY DEVICE

CROSS-REFERENCE TO RELATED APPLICATION(S)

This application claims priority to and benefits of Korean Patent Application No. 10-2021-0073726 under 35 U.S.C. § 119 filed on Jun. 7, 2021, in the Korean Intellectual Property Office, the entire contents of which are incorporated herein by reference.

BACKGROUND

Embodiments described herein relate to a display device that is slid or wound.

Various forms of display devices are used to provide image information. An organic light emitting display (OLED) device, an inorganic light emitting display device, a liquid crystal display (LCD) device, a plasma display device, and the like are used as display devices.

Recently, with the development of display device technologies, various forms of display devices have been developed. For example, various flexible display devices that can be curved, folded, or rolled have been developed. The flexible display devices may be easy to carry and may improve user convenience.

SUMMARY

The embodiments provide a display device having improved reliability when sliding or rolling.

According to an embodiment, a display device may comprise a display panel, and a support layer disposed under the display panel. The display panel may include a display area where an image is displayed in a bending area and in a non-bending area, and a non-display area disposed adjacent to the display area in the bending area and in the non-bending area. The display device may be bent in the bending area during a sliding motion and not bent in the non-bending area adjacent to the bending area during the sliding motion. The non-display area that is disposed in the bending area may include pattern areas and non-pattern areas adjacent to the pattern areas. Each of the pattern areas may include a concave portion and a remaining portion.

According to an embodiment, the display device may slide about a central axis parallel to a first direction. A first width of the remaining portion in the first direction may be smaller than or equal to a second width of the non-pattern areas in the first direction.

According to an embodiment, the support layer may include support bars extending in the first direction and spaced apart from each other in a second direction intersecting the first direction. The display device may slide in the second direction.

According to an embodiment, a distance in the second direction between two non-pattern areas adjacent to each other among the non-pattern areas may be equal to or smaller than a distance in the second direction between two support bars adjacent to each other among the support bars.

According to an embodiment, the concave portion of at least one of the pattern areas may include a curved shape.

According to an embodiment, the concave portion of at least one of the pattern areas may include a polygonal shape.

According to an embodiment, the concave portion of at least one of the pattern areas may be disposed only in the non-display area that is disposed the bending area.

According to an embodiment, the display device may further include a window disposed over the display panel.

According to an embodiment, the window may include a light transmitting area corresponding to the display area that is disposed in the bending area and in the non-bending area, and a bezel area corresponding to the non-display area that is disposed the bending area and in the non-bending area. The bezel area may overlap the concave portion of at least one of the pattern areas.

According to an embodiment, the window may include a light transmitting area corresponding to the display area that is disposed in the bending area and in the non-bending area, and a bezel area corresponding to the non-display area that is disposed in the bending area and in the non-bending area. The bezel area may not overlap the concave portion of at least one of the pattern areas.

According to an embodiment, a display device may include a display panel and a support layer disposed under the display panel. The display panel may include a display area that displays an image and a non-display area adjacent to the display area. The display device may be wound about a central axis that is parallel to a first direction. The non-display area may include a pattern areas and non-pattern areas adjacent to the pattern areas. Each of the pattern areas may include a concave portion and a remaining portion. A first width of the remaining portion of at least one of the pattern areas in the first direction is smaller than a second width of at least one of the non-pattern areas in the first direction.

According to an embodiment, the first width of the remaining portion of the at least one of the pattern areas may decrease as a distance between the remaining portion of the at least one of the pattern areas and the central axis increases.

According to an embodiment, the display device may be wound in a second direction intersecting the first direction. A distance in in the second direction between two non-pattern areas adjacent to each other among the non-pattern areas may increase as a distance between the two non-pattern areas adjacent to each other among the non-pattern areas and the central axis increases.

According to an embodiment, the concave portion of at least one of the pattern areas may include a curved shape.

According to an embodiment, the concave portion of at least one of the pattern areas may include a polygonal shape.

According to an embodiment, the display device may further include a window disposed over the display panel.

According to an embodiment, the window may include a light transmitting area corresponding to the display area and a bezel area corresponding to the non-display area. The bezel area may overlap the concave portion of at least one of the pattern areas.

According to an embodiment, the window may include a light transmitting area corresponding to the display area and a bezel area corresponding to the non-display area. The bezel area may not overlap the concave portion of at least one of the pattern areas.

According to an embodiment, the support layer may include support bars that extend in the first direction and that are spaced apart from each other in a second direction intersecting the first direction. The display device may be wound in the second direction.

According to an embodiment, a distance in the second direction between two non-pattern areas adjacent to each other among the non-pattern areas may be equal to or smaller than a distance in the second direction between two support bars adjacent to each other among the support bars.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1A:
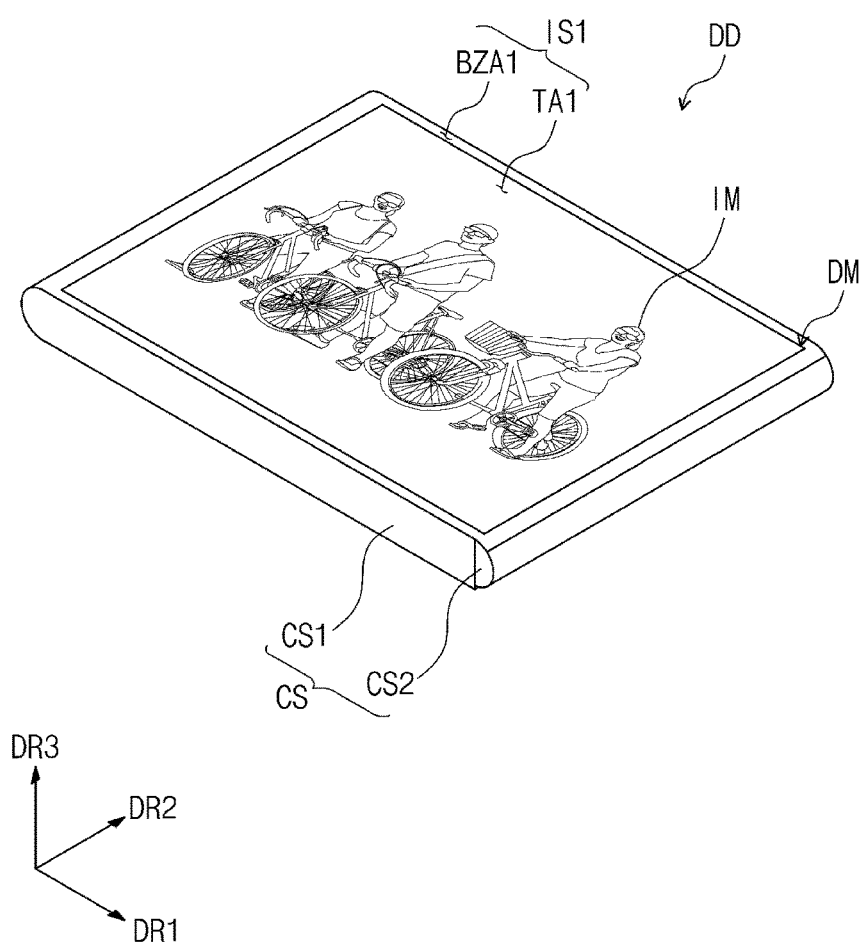
FIG. 1A is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when a component (or, an area, a layer, a part, etc.) is referred to as being "on," "connected to" or "coupled to" another component, the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. The terms of a singular form may include plural forms unless otherwise specified.

Terms such as "below," "under," "above," and "over" are used to describe a relationship of components illustrated in the drawings. The terms are relative concepts and are described based on directions illustrated in the drawing.

It should be understood that terms such as "comprise," "include," and "have" when used herein, specify the presence of stated features, numbers, steps, operations, components, parts, or combinations thereof, but do not preclude the presence or addition of one or more other features, numbers, steps, operations, components, parts, or combinations thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art When an element is described as 'not overlapping' or 'to not overlap' another element, this may include that the elements are spaced apart from each other, offset from each other, or set aside from each other or any other suitable term as would be appreciated and understood by those of ordinary skill in the art.

Unless otherwise defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, embodiments will be described with reference to the accompanying drawings.

Figure 1B:
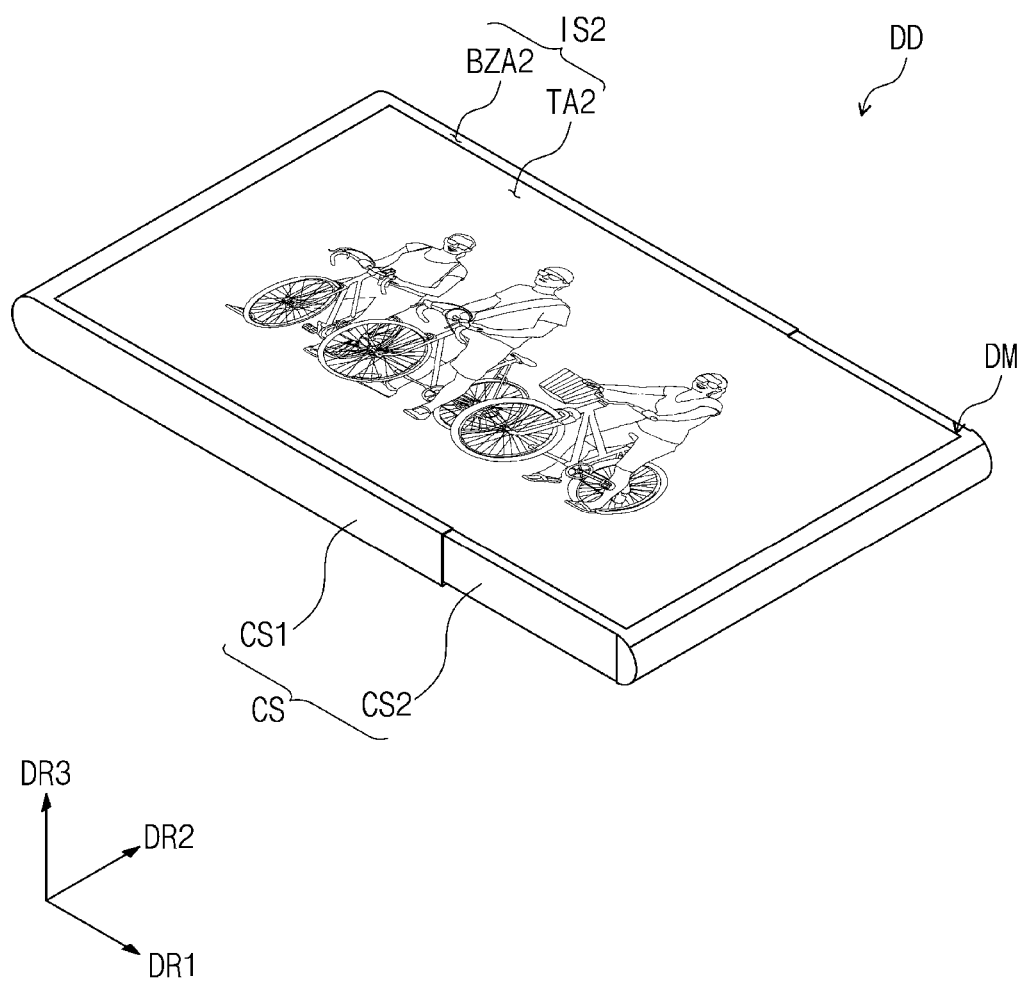
FIG. 1B is a schematic perspective view of an open state of the display device illustrated in FIG. 1A.

FIG. 1A is a schematic perspective view of a display device according to an embodiment, and FIG. 1B is a schematic perspective view of an open state of the display device illustrated in FIG. 1A.

Referring to FIGS. 1A and 1B, the display device DD may be activated in response to an electrical signal. The display device DD according to the disclosure may be a large display device such as a television, a monitor, or the like, or may be a small and medium-sized display device such as a mobile phone, a tablet computer, a car navigation system, a game machine, or the like. These are merely illustrative, and the display device DD may be employed for other electronic devices that do not deviate from the concept of the disclosure.

The display device DD may have a rectangular shape with long sides extending in a first direction DR1 and short sides extending in a second direction DR2 intersecting the first direction DR1. In an embodiment, the second direction DR2 may be perpendicular to the first direction DR1. However, the embodiments are not limited thereto, and the display device DD may have various shapes.

The display device DD may display an image IM in a third direction DR3 on a display surface IS1 parallel to the first direction DR1 and the second direction DR2. The display surface IS1 on which the image IM is displayed may correspond to the front surface of the display device DD.

In an embodiment, front surfaces (or, upper surfaces) and rear surfaces (or, lower surfaces) of members are defined with respect to the direction in which the image IM is displayed. The front surfaces and the rear surfaces may be opposite to each other in the third direction DR3, and the normal directions of the front surfaces and the rear surfaces may be parallel to the third direction DR3.

The separation distance between the front surface and the rear surface of the display device DD in the third direction DR3 may correspond to the thickness of the display device DD in the third direction DR3. The directions indicated by the first, second, and third directions DR1, DR2, and DR3 may be relative concepts and may be changed to different directions.

The front surface of the display device DD may be divided into a light transmitting area TA1 and a bezel area BZA1. The light transmitting area TA1 may be an area where the image IM is displayed. A user views the image IM through the light transmitting area TA1. In this embodiment, the light transmitting area TA1 is illustrated in a quadrilateral shape. However, this is illustrative, and the light transmitting area TA1 may have various shapes and is not limited to any one embodiment.

The bezel area BZA1 may be adjacent to the light transmitting area TA1. The bezel area BZA1 may have a selected color. The bezel area BZA1 may surround the light transmitting area TA1. Accordingly, the shape of the light transmitting area TA1 may be substantially defined by the bezel area BZA1. However, this is illustrative, and the bezel area BZA1 may be disposed adjacent to only one side of the light transmitting area TA1, or may be omitted. The display device DD according to the embodiment may include various embodiments and is not limited to any one embodiment.

The display device DD may include a display module DM and a case CS.

The display device DD according to an embodiment may be an expandable display device that is flexible and expandable. In an embodiment, the display device DD may correspond to a display device DD that performs a sliding motion, among expandable display devices. The display module DM of the display device DD that performs a sliding motion may be expanded or reduced depending on a sliding motion of the case CS.

In an embodiment, the case CS may accommodate the display module DM. The display module DM may be fixed to the case CS and may be expanded depending on a sliding motion of the case CS in the first direction DR1. The case CS includes a first case CS1 and a second case CS2. The second case CS2 may be coupled with the first case CS1 and may be moved in the first direction DR1. In an embodiment, one end of the display module DM may be fixed to one end of the first case CS1. An opposite end of the display module DM may be fixed to one end of the second case CS2. When the second case CS2 is moved in the first direction DR1, the display module DM fixed to the first and second cases CS1 and CS2 may be expanded in the first direction DR1.

FIG. 1A illustrates the display device DD before a sliding motion, and FIG. 1B illustrates the display device DD after the sliding motion. The display module DM illustrated in FIG. 1A may be in a reduced state, compared to the display module DM illustrated in FIG. 1B. The display module DM illustrated in FIG. 1B may be in an expanded state, compared to the display module DM illustrated in FIG. 1A. The light transmitting area TA2 of the display module DM in the expanded state may be larger than the light transmitting area TA1 of the display module DM in the reduced state. The user may view the image IM through the expanded light transmitting area TA2.

Figure 2:
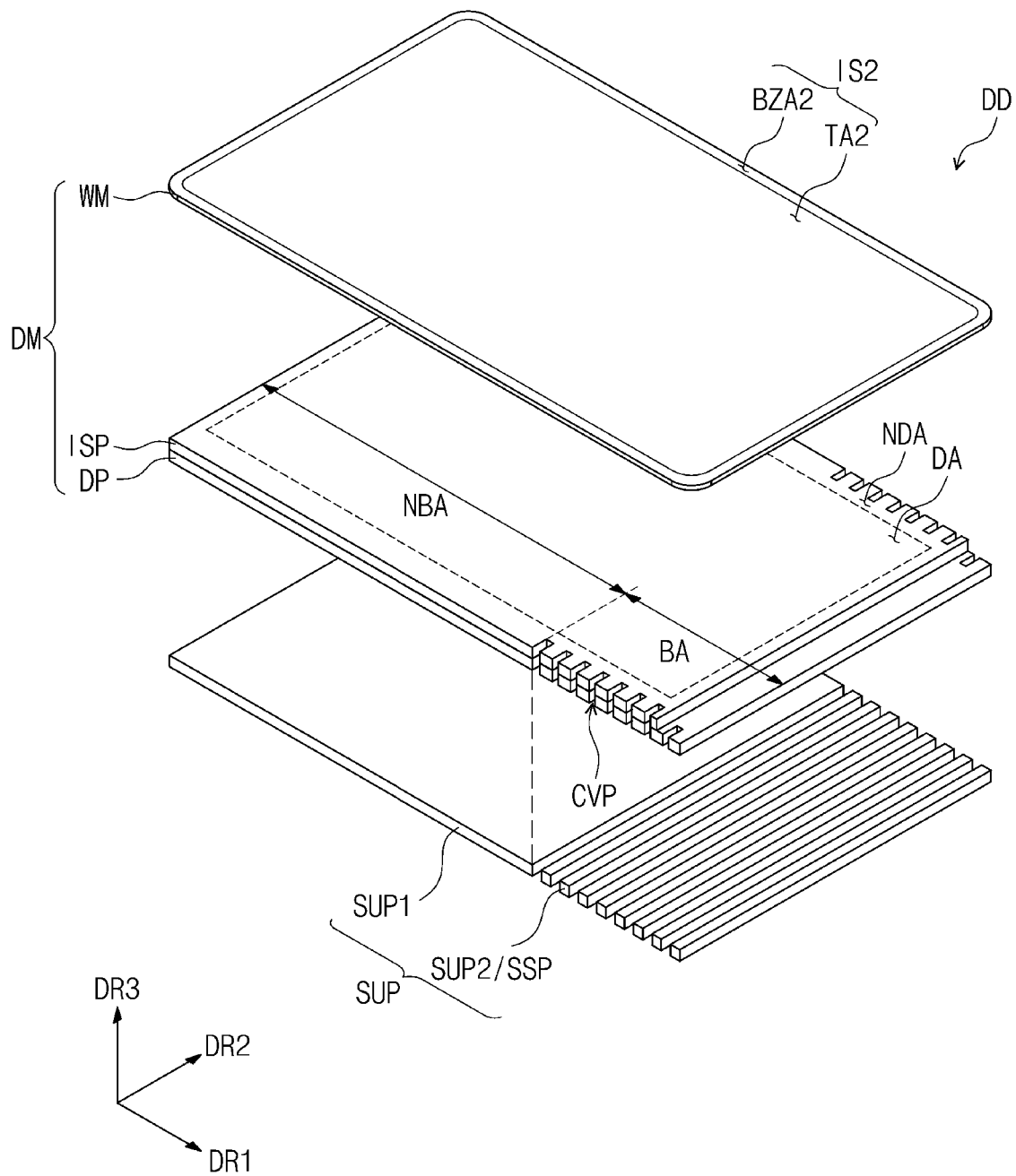
FIG. 2 is an exploded schematic perspective view of a display module and a support layer according to an embodiment.
Figure 3:
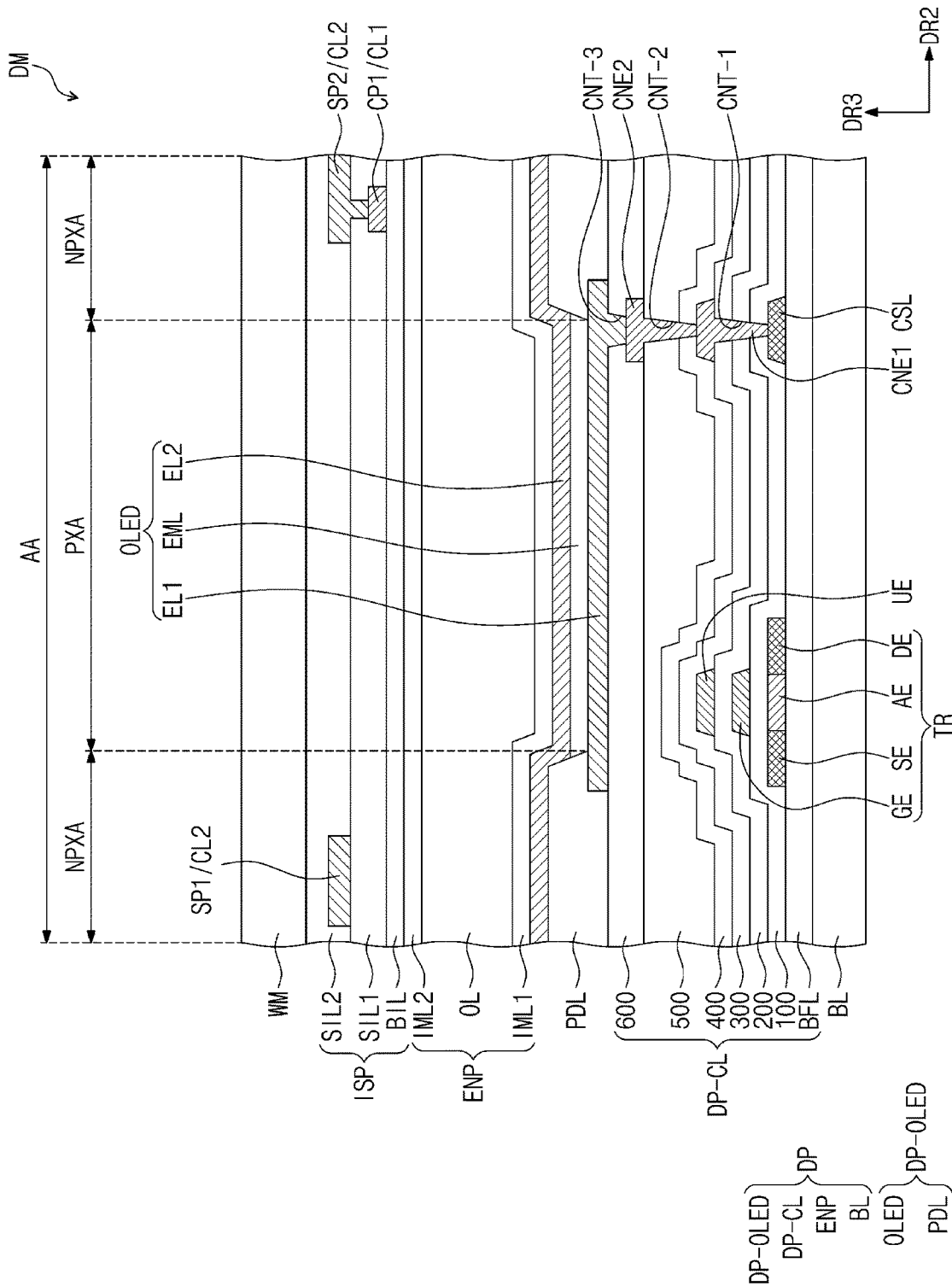
FIG. 3 is a schematic cross-sectional view of part of a display area of the display module according to an embodiment.

FIG. 2 is an exploded schematic perspective view of the display module and a support layer according to an embodiment. FIG. 3 is a sectional view of part of a display area of the display module according to an embodiment.

Referring to FIG. 2, in an embodiment, the display module DM may include a display panel DP, an input sensing layer ISP disposed over the display panel DP, and a window WM disposed over the input sensing layer ISP.

The display panel DP according to an embodiment may be an emissive display panel. For example, the display panel DP may be an organic light emitting display panel, an inorganic light emitting display panel, or a quantum dot light emitting display panel. An emissive layer of the organic light emitting display panel may contain an organic light emitting material. An emissive layer of the inorganic light emitting display panel may contain an inorganic light emitting material. An emissive layer of the quantum dot light emitting display panel may contain quantum dots, quantum rods, and the like.

The display panel DP may output the image IM (refer to FIG. 1A), and the output image IM may be displayed through a display surface IS2.

The input sensing layer ISP may be disposed over the display panel DP and may sense an external input. The input sensing layer ISP may be directly disposed on the display panel DP. According to an embodiment, the input sensing layer ISP may be formed on the display panel DP by a continuous process. When the input sensing layer ISP is directly disposed on the display panel DP, an internal adhesive film (not illustrated) may not be disposed between the input sensing layer ISP and the display panel DP. In other examples, an internal adhesive film may be disposed between the input sensing layer ISP and the display panel DP. The input sensing layer ISP may not be manufactured together with the display panel DP by a continuous process and may be manufactured separately from the display panel DP and then fixed to the upper surface of the display panel DP by the internal adhesive film. In other embodiments, the display device DD may not include the input sensing layer ISP.

The window WM may be formed of a transparent material through which the image IM is able to be output. For example, the window WM may be formed of glass, sapphire, plastic, or the like. Although the window WM is illustrated as a single layer, the window WM is not limited thereto and may include multiple layers.

A bezel area BZA2 of the above-described display device DD may be formed by printing a material having a selected color on one area of the window WM. In an embodiment, the window WM may include a light blocking pattern for defining the bezel area BZA2. The light blocking pattern may be a colored organic film and may be formed by, for example, coating.

The window WM may be coupled to the input sensing layer ISP through an adhesive film. In an embodiment, the adhesive film may include an optically clear adhesive (OCA) film. However, without being limited thereto, the adhesive film may include a general adhesive or sticky material. For example, the adhesive film may include an optically clear resin (OCR) or a pressure sensitive adhesive (PSA) film.

An anti-reflection layer may be disposed between the window WM and the input sensing layer ISP. The anti-reflection layer decreases the reflectivity of external light incident from above the window WM. The anti-reflection layer according to an embodiment may include a phase retarder and a polarizer. The phase retarder may be of a film type or a liquid-crystal coating type and may include a λ/2 phase retarder and/or a λ/4 phase retarder. The polarizer may also be of a film type or a liquid-crystal coating type. The film type polarizer may include a stretchable synthetic resin film, and the liquid-crystal coating type polarizer may include liquid crystals arranged in a selected arrangement. The phase retarder and the polarizer may be implemented with one polarizer film.

The display panel DP may display an image depending on an electrical signal, and the input sensing layer ISP may transmit/receive information about an external input. The display panel DP may include a display area DA and a non-display area NDA. The display area DA may be defined as an area that outputs an image provided by the display panel DP. The non-display area NDA is adjacent to the display area DA. For example, the non-display area NDA may surround the display area DA. However, this is illustrative, and the non-display area NDA may be defined in various shapes and is not limited thereto. According to an embodiment, the display area DA of the display panel DP may correspond to at least part of the light transmitting area TA2 of the window WM.

The display area DA may be defined as an area where the input sensing layer ISP senses an external input applied from the outside.

The support layer SUP may be disposed under the display module DM. The support layer SUP may be accommodated in the case CS (refer to FIG. 1A) in a state of being coupled with the display module DM. The support layer SUP may be formed of a material having higher rigidity than the display module DM. In an embodiment, the support layer SUP may contain metal such as aluminum.

In an embodiment, the support layer SUP may include a first support layer SUP1 and a second support layer SUP2. The first support layer SUP1 and the second support layer SUP2 may be spaced apart from each other in the first direction DR1.

In an embodiment, the second support layer SUP2 may include support bars SSP. The support bars SSP may extend in the second direction DR2 and may be spaced apart from each other in the first direction DR1. The support bars SSP may have a rectangular shape. However, the disclosure is not limited thereto. In an embodiment, the support bars SSP may have an inverted trapezoidal shape in which a first surface adjacent to the display surface IS2 of the display module DM has a larger width than a second surface that faces the first surface.

Although the support bars SSP spaced apart from each other in the first direction DR1 are illustrated in FIG. 2, the structure of the support bars SSP is not limited thereto. In an embodiment, the support bars SSP may be implemented in a joint structure in which the support bars SSP are coupled and may rotate.

Referring to FIGS. 1A to 2, the display module DM may include a bending area BA and a non-bending area NBA that is adjacent to the bending area BA. The bending area BA is defined as an area that is bent when the display device DD performs a sliding motion. The non-bending area NBA is defined as an area that is not bent even when the display device DD performs the sliding motion.

Figure 4:
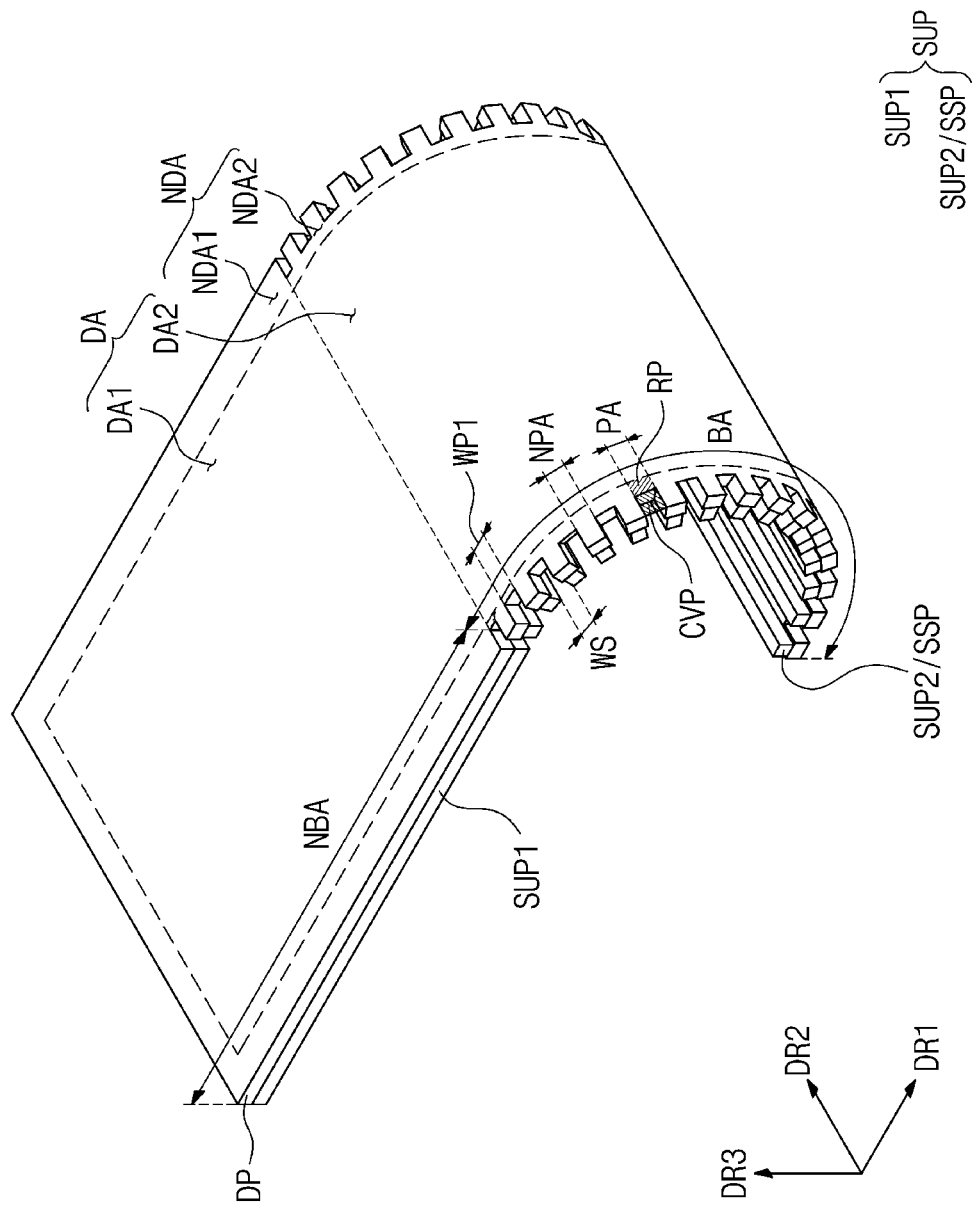
FIG. 4 is a schematic perspective view of a display panel and the support layer when the display device in FIG. 1A is bent.

In an embodiment, the display area DA includes a first display area DA1 (refer to FIG. 4) and a second display area DA2 (refer to FIG. 4). The non-display area NDA includes a first non-display area NDA1 (refer to FIG. 4) and a second non-display area NDA2 (refer to FIG. 4). The first display area DA1 and the first non-display area NDA1 may be included in the non-bending area NBA. The second display area DA2 and the second non-display area NDA2 may be included in the bending area BA.

The first support layer SUP1 may support the non-bending area NBA of the display module DM. The first support layer SUP1 may overlap the non-bending area NBA of the display module DM. The second support layer SUP2 may support the bending area BA of the display module DM. The second support layer SUP2 may overlap the bending area BA of the display module DM.

When the display device DD performs a sliding motion, stress may be applied to the bending area BA of the display module DM. In an embodiment, to alleviate the stress applied to the bending area BA of the display module DM, concave portions CVP may be formed in the second non-display area NDA2 of the display module DM. The shape and arrangement of the concave portions CVP will be described below with reference to FIGS. 4 to 6D.

Referring to FIG. 3, the display panel DP included in the display module DM includes a base layer BL, a circuit element layer DP-CL, a display element layer DP-OLED, and an encapsulation layer ENP.

In an embodiment, the base layer BL may include a synthetic resin layer. The synthetic resin layer may contain a thermosetting resin. The base layer BL may have a multi-layer structure. For example, the base layer BL may have a three-layer structure including a synthetic resin layer, an adhesive layer, and a synthetic resin layer. The synthetic resin layers may be polyimide-based resin layers, and the materials are not particularly limited. The synthetic resin layers may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer BL may include a glass substrate, a metal substrate, an organic/inorganic composite substrate, or the like.

At least one inorganic layer may be disposed on the upper surface of the base layer BL. The inorganic layer may contain at least one of aluminum oxide, titanium oxide, silicon oxide, silicon oxy nitride, zirconium oxide, and hafnium oxide. The inorganic layer may be formed in multiple layers. The multiple inorganic layers may constitute a barrier layer and/or a buffer layer. In this embodiment, the circuit element layer DP-CL is illustrated as including a buffer layer BFL.

The circuit element layer DP-CL may include intermediate insulating layers, a semiconductor pattern, a conductive pattern, a signal line, and the like. The intermediate insulating layers, a semiconductor layer, and a conductive layer may be formed by coating, deposition, or the like. Thereafter, the intermediate insulating layers, the semiconductor layer, and the conductive layer may be selectively subjected to patterning by photolithography. The semiconductor pattern, the conductive pattern, the signal line, and the like included in the circuit element layer DP-CL may be formed in this way.

The circuit element layer DP-CL may include the buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600.

The buffer layer BFL may improve a coupling force between the base layer BL and the semiconductor pattern.

The buffer layer BFL may include silicon oxide layers and silicon nitride layers. The silicon oxide layers, and the silicon nitride layers may be alternately stacked one above another.

The semiconductor pattern may be disposed on the buffer layer BFL. The semiconductor pattern may contain polysilicon. In other examples, the semiconductor pattern may contain amorphous silicon or metal oxide.

FIG. 3 illustrates only part of the semiconductor pattern, and the semiconductor pattern may be disposed in other areas of a pixel on the plane. The semiconductor pattern may be arranged across pixels according to a selected rule. The semiconductor pattern may have different electrical properties depending on whether the semiconductor pattern is doped or not. The semiconductor pattern may include a first semiconductor area having a high conductivity and a second semiconductor area having a low conductivity. The first semiconductor area may be doped with an N-type dopant or a P-type dopant. A P-type transistor includes a doping area doped with a P-type dopant. The second semiconductor area may be an undoped area, or may be doped more lightly than the first semiconductor area.

The first semiconductor area may have a higher conductivity than the second semiconductor area and substantially serves as an electrode or a signal line. The second semiconductor area substantially corresponds to a channel (or, active) area of a transistor. A portion of the semiconductor pattern may be a channel area of a transistor, another portion may be a source or drain area of the transistor, and another portion may be a connecting electrode or a connecting signal line.

As illustrated in FIG. 3, a source area SE, a channel area AE, and a drain area DE of a transistor TR may be formed from the semiconductor pattern. The source area SE and the drain area DE may extend from the channel area AE in opposite directions on the section. FIG. 3 illustrates part of a connecting signal line CSL formed from the semiconductor pattern. Although not separately illustrated, the connecting signal line CSL may be electrically connected to the drain area DE of the transistor TR on the plane.

The first intermediate insulating layer 100 may be disposed on the buffer layer BFL. The first intermediate insulating layer 100 may overlap multiple pixels and may cover the semiconductor pattern. The first intermediate insulating layer 100 may be an inorganic layer and/or an organic layer and may have a single layer structure or a multi-layer structure. The first intermediate insulating layer 100 may contain at least one of aluminum oxide, titanium oxide, silicon oxide, silicon oxy nitride, zirconium oxide, and hafnium oxide. In an embodiment, the first intermediate insulating layer 100 may be a single layer of silicon oxide. Not only the first intermediate insulating layer 100 but also the intermediate insulating layers 200, 300, 400, 500, and 600 of the circuit element layer DP-CL, which will be described below, may be inorganic layers and/or organic layers and may have a single layer structure or a multi-layer structure. The inorganic layers may contain at least one of the materials used for intermediate layer 100.

A gate GE of the transistor TR may be disposed on the first intermediate insulating layer 100. The gate GE may be part of a metal pattern. The gate GE may overlap the channel area AE. The gate GE may function as a mask in a process of doping the semiconductor pattern.

The second intermediate insulating layer 200 covering the gate GE may be disposed on the first intermediate insulating layer 100. The second intermediate insulating layer 200 may overlap the pixels. The second intermediate insulating layer 200 may be an inorganic layer and/or an organic layer and may have a single layer structure or a multi-layer structure. In this embodiment, the second intermediate insulating layer 200 may be a single layer of silicon oxide.

An upper electrode UE is disposed on the second intermediate insulating layer 200. The upper electrode UE may overlap the gate GE. The upper electrode UE may be part of the metal pattern. Part of the gate GE and the upper electrode UE overlapping the gate GE may define a capacitor. In other embodiments, the upper electrode UE may be omitted.

The third intermediate insulating layer 300 covering the upper electrode UE may be disposed on the second intermediate insulating layer 200. The third intermediate insulating layer 300 may overlap the pixels. The third intermediate insulating layer 300 may be an inorganic layer and/or an organic layer and may have a single layer structure or a multi-layer structure. In this embodiment, the third intermediate insulating layer 300 may be a single layer of silicon oxide.

A first connecting electrode CNE1 may be disposed on the third intermediate insulating layer 300. The first connecting electrode CNE1 may be connected to the connecting signal line CSL through a first contact hole CNT-1 formed through the first, second, and third intermediate insulating layers 100, 200, and 300.

The fourth intermediate insulating layer 400 may be disposed on the third intermediate insulating layer 300. The fourth intermediate insulating layer 400 may be a signal layer of silicon oxide.

The fifth intermediate insulating layer 500 may be disposed on the fourth intermediate insulating layer 400. The fifth intermediate insulating layer 500 may be an organic layer. A second connecting electrode CNE2 may be disposed on the fifth intermediate insulating layer 500. The second connecting electrode CNE2 may be connected to the first connecting electrode CNE1 through a second contact hole CNT-2 formed through the fourth and fifth intermediate insulating layers 400 and 500.

The sixth intermediate insulating layer 600 covering the second connecting electrode CNE2 may be disposed on the fifth intermediate insulating layer 500. The sixth intermediate insulating layer 600 may be an organic layer.

The display element layer DP-OLED may be formed on the circuit element layer DP-CL. In an embodiment, the display element layer DP-OLED may include a light emitting element OLED and a pixel defining film PDL.

The light emitting element OLED may include a first electrode EL1 disposed on the circuit element layer DP-CL, an emissive layer EML disposed on the first electrode EL1, and a second electrode EL2 disposed on the emissive layer EML.

The first electrode EL1 may be disposed on the sixth intermediate insulating layer 600. The first electrode EL1 may be connected to the second connecting electrode CNE2 through a third contact hole CNT-3 formed through the sixth intermediate insulating layer 600.

The pixel defining film PDL may be disposed on the sixth intermediate insulating layer 600 and may cover part of the first electrode EL1. A pixel opening is defined in the pixel defining film PDL. The pixel opening exposes at least part of the first electrode EL1. In an embodiment, an emissive area PXA may correspond to an area of the first electrode EL1 exposed by the pixel opening. A non-emissive area NPXA may surround the emissive area PXA.

The emissive layer EML is disposed on the first electrode EL1. The emissive layer EML may be disposed in an area corresponding to the pixel opening. The emissive layer EML may be separately disposed for each of the pixels. The emissive layer EML may contain a luminescent material including a fluorescent material or a phosphorescent material. The luminescent material may include an organic luminescent material, or an inorganic luminescent material and the embodiments are not limited by the type of luminescent material.

The second electrode EL2 may be disposed on the emissive layer EML. The second electrode EL2 may have an integrated shape and may be disposed on multiple pixels.

In an embodiment, the light emitting element OLED may further include a hole control layer and an electron control layer. The hole control layer may be disposed between the first electrode EL1 and the emissive layer EML and may further include a hole injection layer. The electron control layer may be disposed between the emissive layer EML and the second electrode EL2 and may further include an electron injection layer.

The encapsulation layer ENP may be disposed on the display element layer DP-OLED. The encapsulation layer ENP may be disposed on the second electrode EL2.

The encapsulation layer ENP may be disposed on multiple pixels. In an embodiment, the encapsulation layer ENP may directly cover the second electrode EL2. In other examples, a capping layer covering the second electrode EL2 may be disposed between the encapsulation layer ENP and the second electrode EL2. The encapsulation layer ENP may directly cover the capping layer.

The encapsulation layer ENP may include a first inorganic layer IML1, an organic layer OL, and a second inorganic layer IML2. The first inorganic layer IML1 and the second inorganic layer IML may protect the light emitting element OLED from moisture and oxygen, and the organic layer OL may protect the light emitting element OLED from foreign matter such as dust particles. The first inorganic layer IML1 and the second inorganic layer IML2 may include a silicon nitride layer, a silicon oxy nitride layer, a silicon oxide layer, a titanium oxide layer, or an aluminum oxide layer. The organic layer OL may include an acrylate-based organic layer, but the embodiments are not limited thereto.

The first inorganic layer IML1 may be disposed on the light emitting element OLED. The organic layer OL may be disposed on the first inorganic layer IML1. The second inorganic layer IML2 may be disposed on the organic layer OL.

The input sensing layer ISP may be formed on the display panel DP. The input sensing layer ISP may include a base insulating layer BIL, a first conductive layer CL1, a first sensing insulation layer SILL a second conductive layer CL2, and a second sensing insulation layer SIL2. In an embodiment, the first and second sensing insulation layers SIL1 and SIL2 may be inorganic layers and/or organic layers and may have a single layer structure or a multi-layer structure.

The base insulating layer BIL may be directly disposed on the encapsulation layer ENP. For example, the base insulating layer BIL may be brought into direct contact with the second inorganic layer IML2. The base insulating layer BIL may have a single layer structure or a multi-layer structure. The base insulating layer BIL may be omitted.

The first conductive layer CL1 may be disposed on the base insulating layer BIL. When the base insulating layer BIL is omitted, the first conductive layer CL1 may be directly disposed on the encapsulation layer ENP. The first sensing insulation layer SIL1 may be disposed on the first conductive layer CL1. The first sensing insulation layer SIL1 may be an inorganic layer and/or an organic layer and may have a single layer structure or a multi-layer structure.

The second conductive layer CL2 may be disposed on the first sensing insulation layer SILL The first conductive layer CL1 and the second conductive layer CL2 may have a single layer structure, or may have a multi-layer structure stacked along the third direction DR3. The conductive layer having a single layer structure may include an electrode layer or a transparent conductive layer.

The first conductive layer CL1 and the second conductive layer CL2 may include first sensor parts SP1, second sensor parts SP2, and first connecting parts CP1. The first conductive layer CL1 may include the first connecting parts CP1 electrically connecting the second sensor parts SP2. The second conductive layer CL2 may include the first sensor parts SP1 and the second sensor parts SP2. Although not illustrated, the second conductive layer CL2 may further include second connecting parts electrically connecting the first sensor parts SP1. In other examples, the first sensor parts SP1, the second sensor parts SP2, and the second connecting parts may be included in the first conductive layer CL1, and the first connecting parts CP1 may be included in the second conductive layer CL2.

The second sensing insulation layer SIL2 may be disposed on the second conductive layer CL2. The second sensing insulation layer SIL2 may be an inorganic layer and/or an organic layer and may have a single layer structure or a multi-layer structure.

In an embodiment, the first sensor parts SP1, the second sensor parts SP2, the first connecting parts CP1, and the second connecting parts may be disposed in the non-emissive area NPXA.

FIG. 4 is a schematic perspective view for explaining the display panel and the support layer when the display device illustrated in FIG. 1A is bent. Hereinafter, identical components described in FIG. 2 will be assigned identical reference numerals, and descriptions will not be repeated.

The display panel DP and the support layer SUP are illustrated in FIG. 4. However, the disclosure is not limited thereto, and when the display device DD (refer to FIG. 1A) includes the input sensing layer ISP, concave portions may be formed in the input sensing layer ISP.

The non-bending area NBA of the display panel DP includes the first display area DA1 and the first non-display area NDA1. The bending area BA of the display panel DP includes the second display area DA2 and the second non-display area NDA2.

The second non-display area NDA2 may include pattern areas PA and non-pattern areas NPA that are adjacent to the pattern areas PA. Each of the pattern areas PA includes a concave portion CVP and a remaining portion RP. In an embodiment, the concave portion CVP may be disposed between two adjacent non-pattern areas NPA. The concave portion CVP may be disposed in the second non-display area NDA2. The concave portion CVP is not included in the second display area DA2.

In an embodiment, the spacing (or distance) in the first direction DR1 between two non-pattern areas NPA adjacent to each may be defined as first pattern spacing WP1. The first pattern spacing WP1 may be equal to the width of a concave portion CVP of the pattern area PA in the first direction DR1. The spacing (or distance) in the first direction DR1 between two support bars adjacent to each other among the support bars SSP may be defined as support spacing WS.

In an embodiment, the first pattern spacing WP1 may be equal to or smaller than the support spacing WS. Each of the support bars SSP may overlap a corresponding one of the non-pattern areas NPA. Accordingly, the support bars SSP may not be visible to users through the concave portions CVP.

The concave portions CVP formed in the bending area BA of the display panel DP may alleviate stress applied to the bending area BA when the display device DD (refer to FIG. 1B) performs a sliding motion. When the concave portions CVP are formed in the bending area BA, an empty space may be formed between two adjacent non-pattern areas NPA and may distribute strain applied to the bending area BA when the display device DD performs a sliding motion. Accordingly, the bending area BA of the display panel DP may be prevented from being damaged by stress applied during the sliding motion, and the reliability of the display panel DP may be improved.

Figure 5:
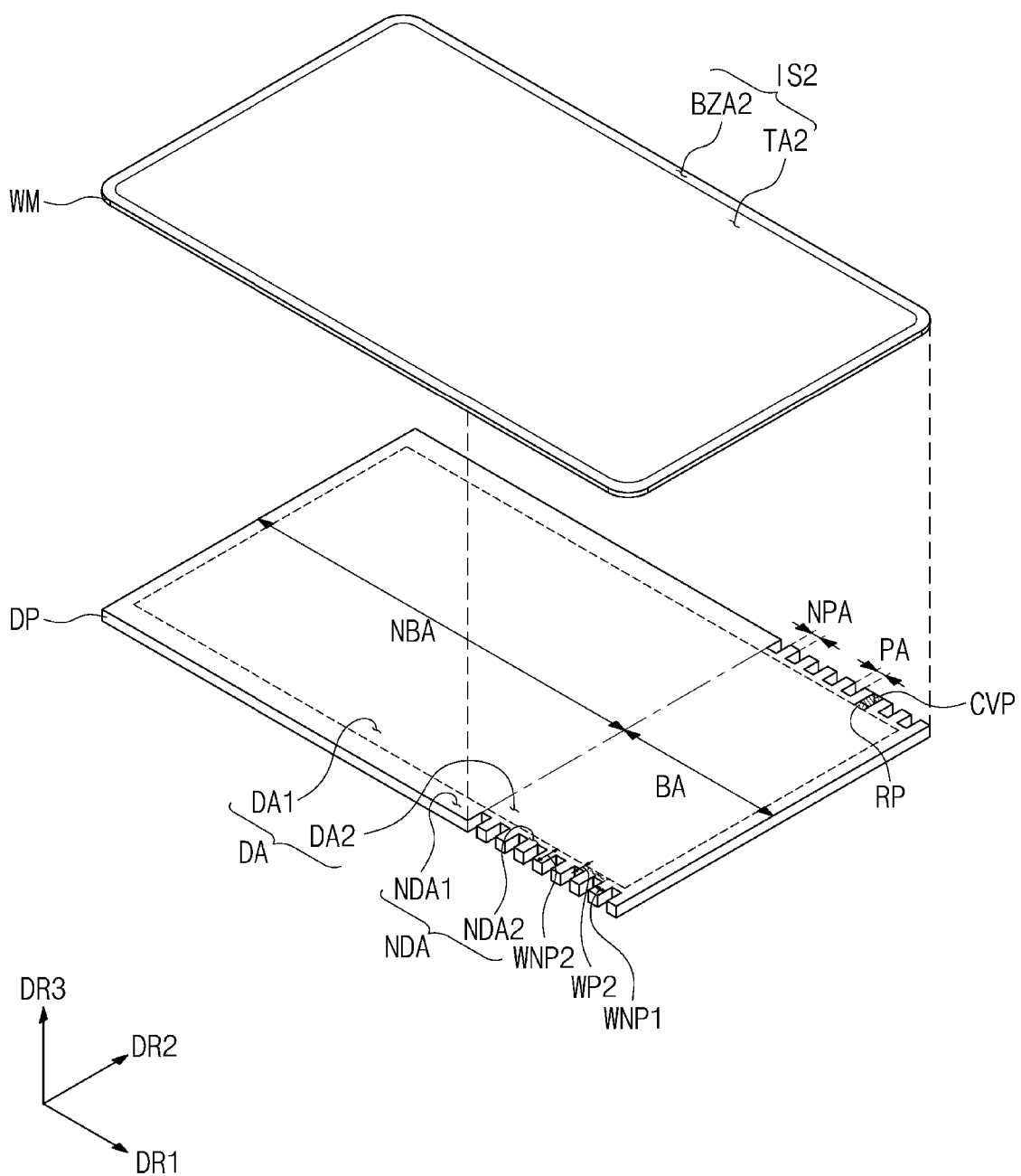
FIG. 5 is an exploded schematic perspective view of the pattern areas and non-pattern areas included in the display panel according to an embodiment.

FIG. 5 is an exploded schematic perspective view for explaining the pattern areas and the non-pattern areas included in the display panel according to an embodiment. Hereinafter, components identical components described above with reference to FIG. 4 will be assigned with identical reference numerals, and repetitive descriptions will be omitted.

Referring to FIG. 5, the spacing (or distance) in the first direction DR1 between two pattern areas adjacent to each other among the pattern areas PA may be defined as first non-pattern spacing WNP1. The first non-pattern spacing WNP1 may be equal to the width of one non-pattern area NPA in the first direction DR1. The first non-pattern spacing WNP1 may be equal to or greater than the support spacing WS (refer to FIG. 4).

The width of each of the pattern areas PA in the second direction DR2 (the distance between two non-pattern areas adjacent to each other) may be defined as second pattern spacing WP2. The width of each of the non-pattern areas NPA in the second direction DR2 (the distance between two pattern areas adjacent to each other) may be defined as second non-pattern spacing WNP2. In an embodiment, the second pattern spacing WP2 is smaller than the second non-pattern spacing WNP2.

The bezel area BZA2 of the window WM may overlap the non-display area NDA of the display panel DP. In an embodiment, as illustrated in FIG. 5, patterns such as the concave portions CVP included in the display panel DP may not be formed in the window WM. In this case, the bezel area BZA2 of the window WM may overlap the concave portions CVP. The concave portions CVP may be hidden by the bezel area BZA2 and may not be visible to a user.

However, although not illustrated, patterns such as the concave portions CVP included in the display panel DP may be formed in the window WM. The bezel area BZA2 of the window WM may not overlap the concave portions CVP. When the patterns such as the concave portions CVP are formed in the window WM, stress applied to a bending area of the window WM during a sliding motion of the display device DD may be alleviated. In this case, the case CS (refer to FIG. 1A) coupled with the display module DM (refer to FIG. 1A) to define the exterior of the display device DD (refer to FIG. 1A) may cover the patterns, such as the concave portions CVP, which are formed in the window WM.

FIGS. 6A to 6D are enlarged schematic plan views for explaining the shapes of concave portions included in pattern areas according to the embodiments. Identical components described above in FIGS. 4 and 5 will be assigned identical reference numerals, and their descriptions will not be repeated.

Figure 6A:
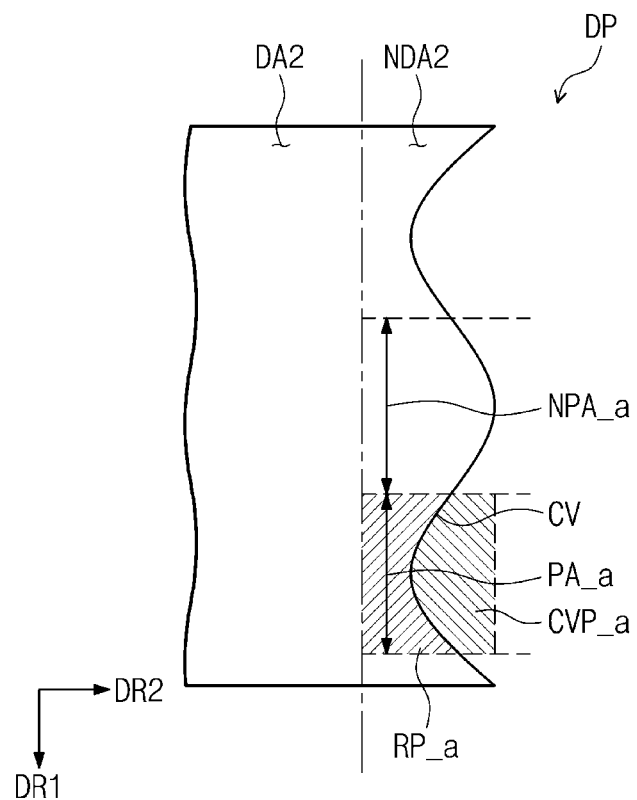
FIGS. 6A to 6D are enlarged schematic plan views of the shapes of concave portions included in pattern areas according to the embodiments.

Referring to FIG. 6A, the pattern areas PA_a may each include a concave portion CVP_a and a remaining portion RP_a. The concave portion CVP_a may have a curved shape CV. The pattern areas PA_a, each including a concave portion CVP_a having the curved shape CV, and the non-pattern areas NPA_a may be included in the second non-display area NDA2.

Figure 6B:
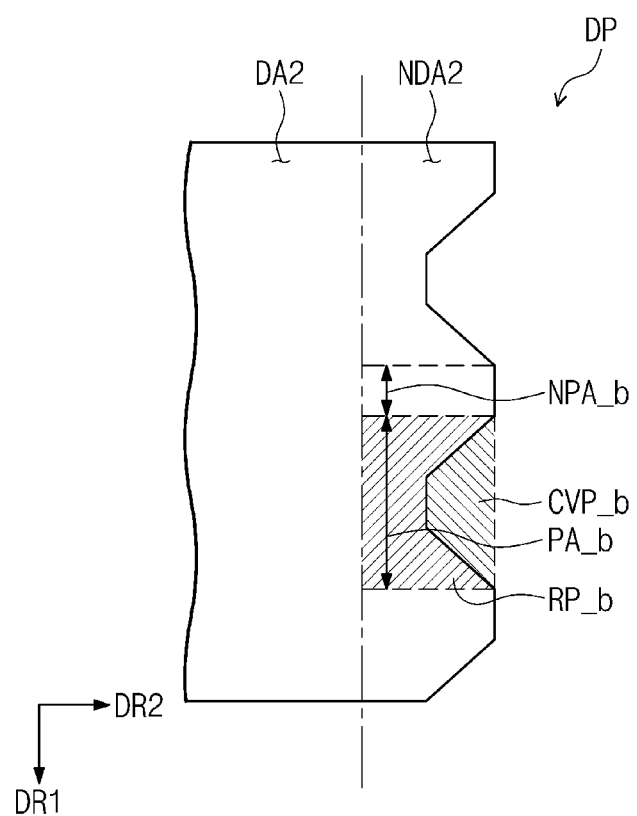
Figure 6C:
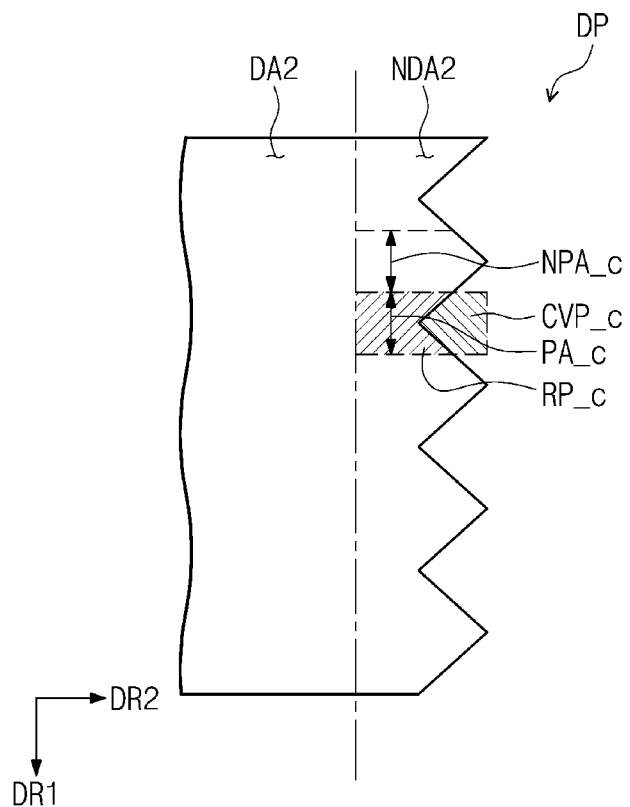

Referring to FIGS. 6B and 6C, pattern areas PA b may each include a concave portion CVP_b and a remaining portion RP_b. Pattern areas PA_c may each include a concave portion CVP_c and a remaining portion RP_c. Each of the concave portions CVP_b and CVP_c may have polygonal shapes. In an embodiment, the concave portion CVP_b illustrated in FIG. 6B may have a trapezoidal shape in which a first side adjacent to the second display area DA2 is shorter than a second side facing the first side. The concave portion CVP_c illustrated in FIG. 6C may have a triangular shape.

Figure 6D:
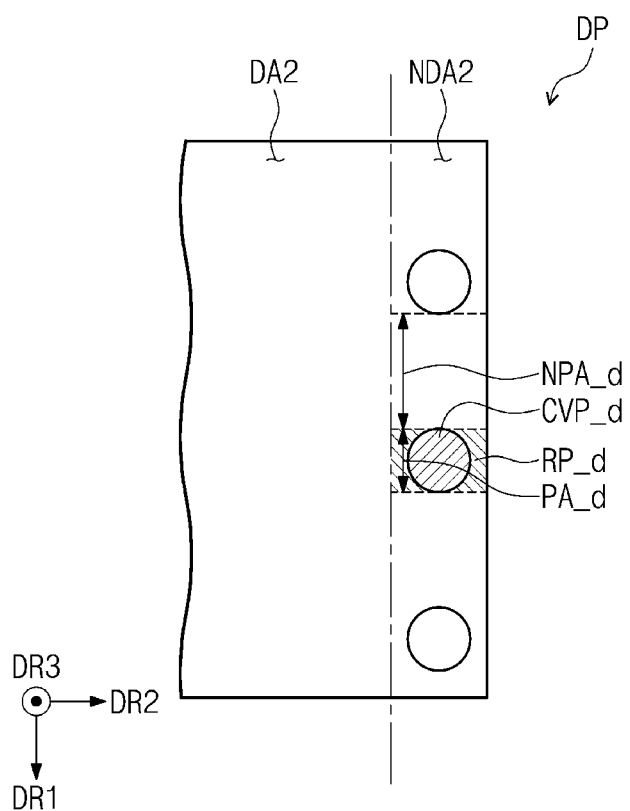

Referring to FIG. 6D, the pattern areas PA_d may each include a concave portion CVP_d formed in the opposite direction to the third direction DR3 and a remaining portion RP d. The concave portion CVP_d may have a circular shape. The concave portion CVP_d may be formed through the display panel DP.

Figure 7:
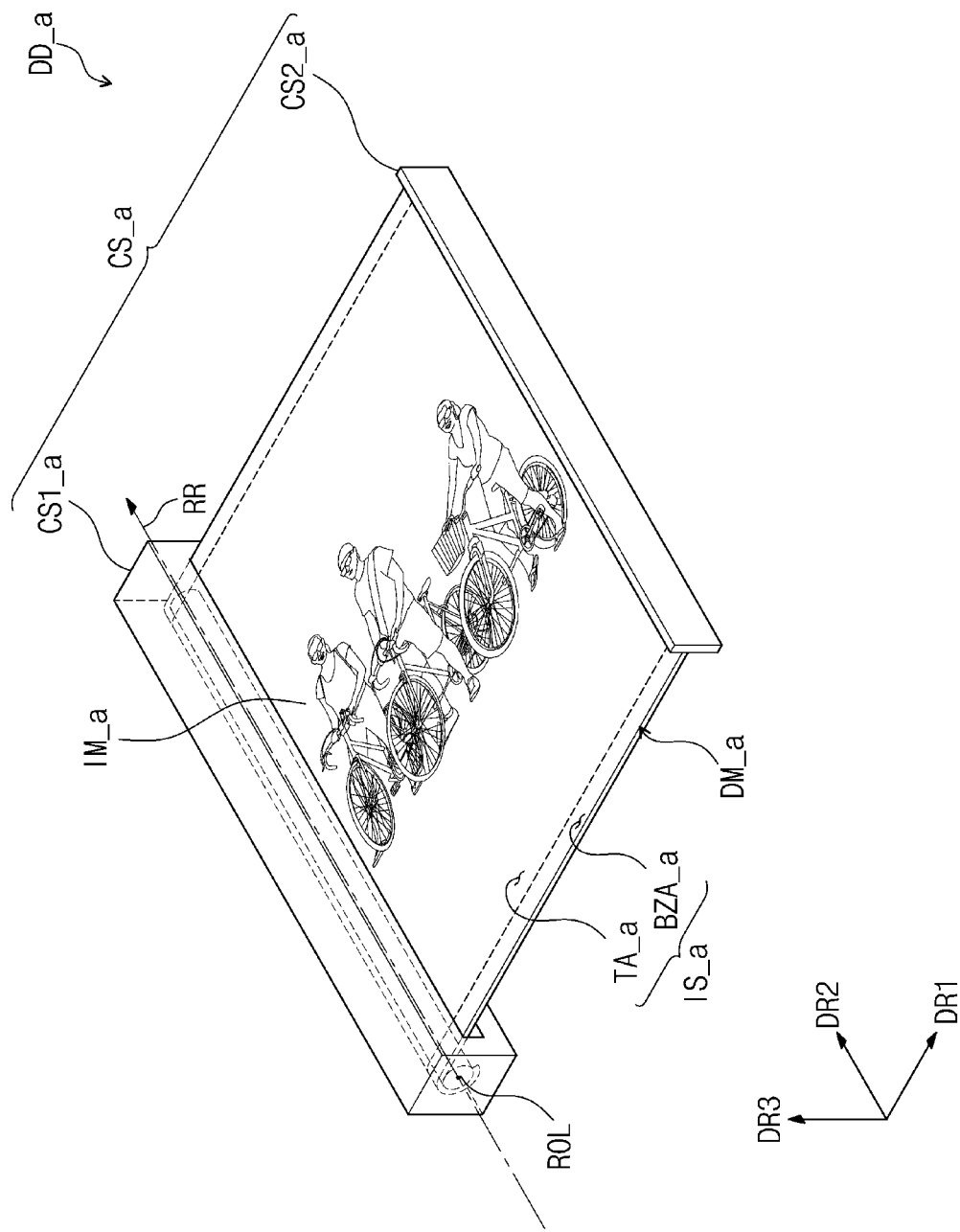
FIG. 7 is a schematic perspective view of a display device according to an embodiment.

FIG. 7 is a schematic perspective view of a display device according to an embodiment.

Referring to FIG. 7, the display device DD_a according to the embodiment may be a flexible display device DD_a that can be rolled. The display device DD_a may be a rollable display device. Identical components described in FIGS. 1A and 1B will be assigned identical reference numerals, and descriptions will not be repeated.

The display device DD_a may include a display module DM_a, a case CS_a, and a roller ROL. In an embodiment, the case CS_a may accommodate the display module DM_a. The display module DM_a may be fixed to the case CS_a. The display module DM_a may be unwound in the first direction DR1 and may be wound in the opposite direction to the first direction DR1.

The case CS_a includes a first case CS1_a and a second case CS2_a. The roller ROL may be included in the first case CS1_a. The roller ROL may rotate about the central axis RR parallel to the second direction DR2. The second case CS2_a may be coupled with the first case CS1_a and may be moved in the first direction DR1. The second case CS2_a may be coupled with the roller ROL included in the first case CS1_a and may be moved depending on rotation of the roller ROL. The second case CS2_a may be unwound in the first direction DR1, or may be wound in the opposite direction to the first direction DR1, depending on a rotational direction of the roller ROL.

The second case CS2_a may accommodate the display module DM_a. The display module DM_a may be fixed to the second case CS2_a. In case that the second case CS2_a is unwound in the first direction DR1, the display module DM_a may also be unwound in the first direction DR1. In case that the second case CS2_a is wound in the opposite direction to the first direction DR1, the display module DM_a may also be wound in the opposite direction to the first direction DR1.

In other embodiments, the display device DD_a may not include the second case CS2_a. The display module DM_a may be coupled to the roller ROL and may be moved by the roller ROL.

Figure 8:
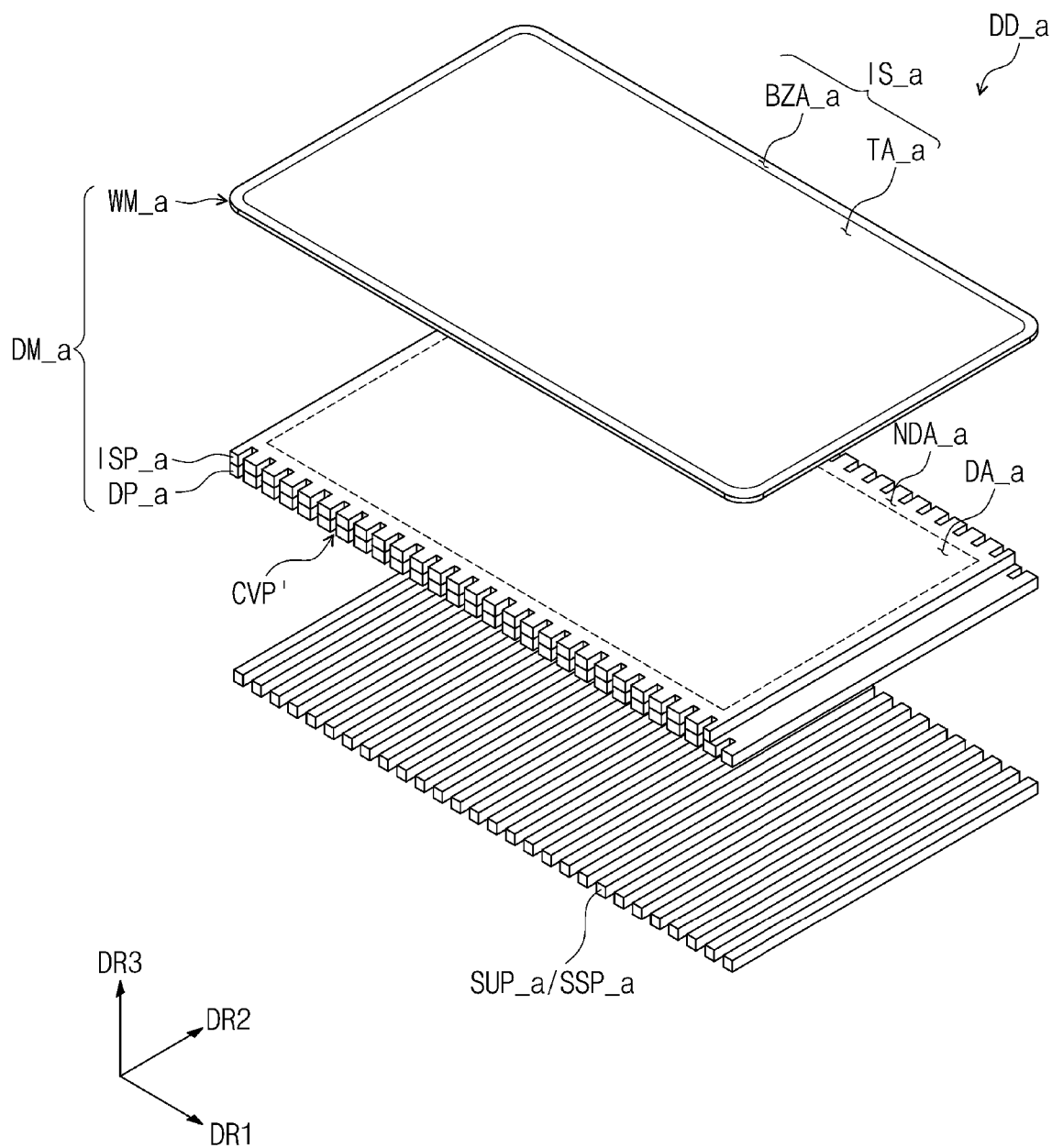
FIG. 8 is an exploded schematic perspective view of a display module and a support layer according to an embodiment.

FIG. 8 is an exploded schematic perspective view of the display module and a support layer according to an embodiment. Identical components described in FIG. 2 will be assigned identical reference numerals, and their descriptions will not be repeated.

In an embodiment, the support layer SUP_a may include support bars SSP_a. The support bars SSP_a may extend in the second direction DR2 and may be spaced apart from each other in the first direction DR1.

The support layer SUP_a may support the display module DM_a. When the display device DD_a is wound or unwound, stress may be applied to the display module DM_a. In an embodiment, to alleviate the stress applied to the display module DM_a, concave portions CVP' may be formed in a non-display area NDA_a of the display module DM_a. The shape and arrangement of the concave portions CVP' will be described below with reference to FIGS. 9 and 10.

Figure 9:
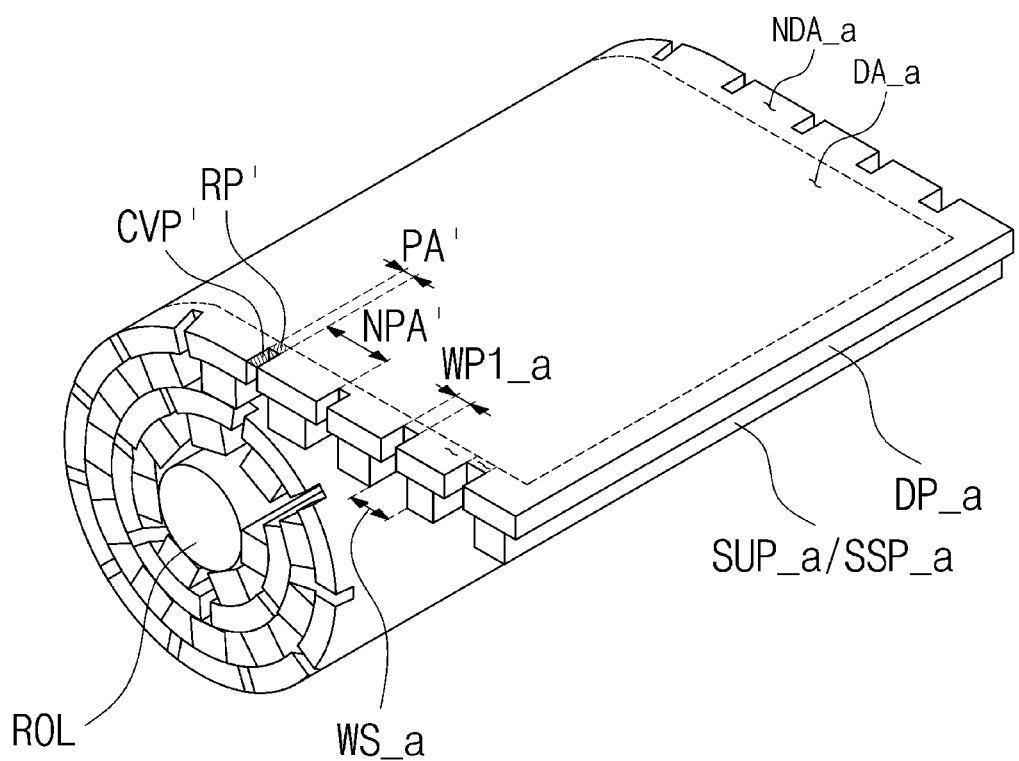
FIG. 9 is a schematic perspective view of a display panel and the support layer when the display device illustrated in FIG. 7 is wound.
Figure 10:
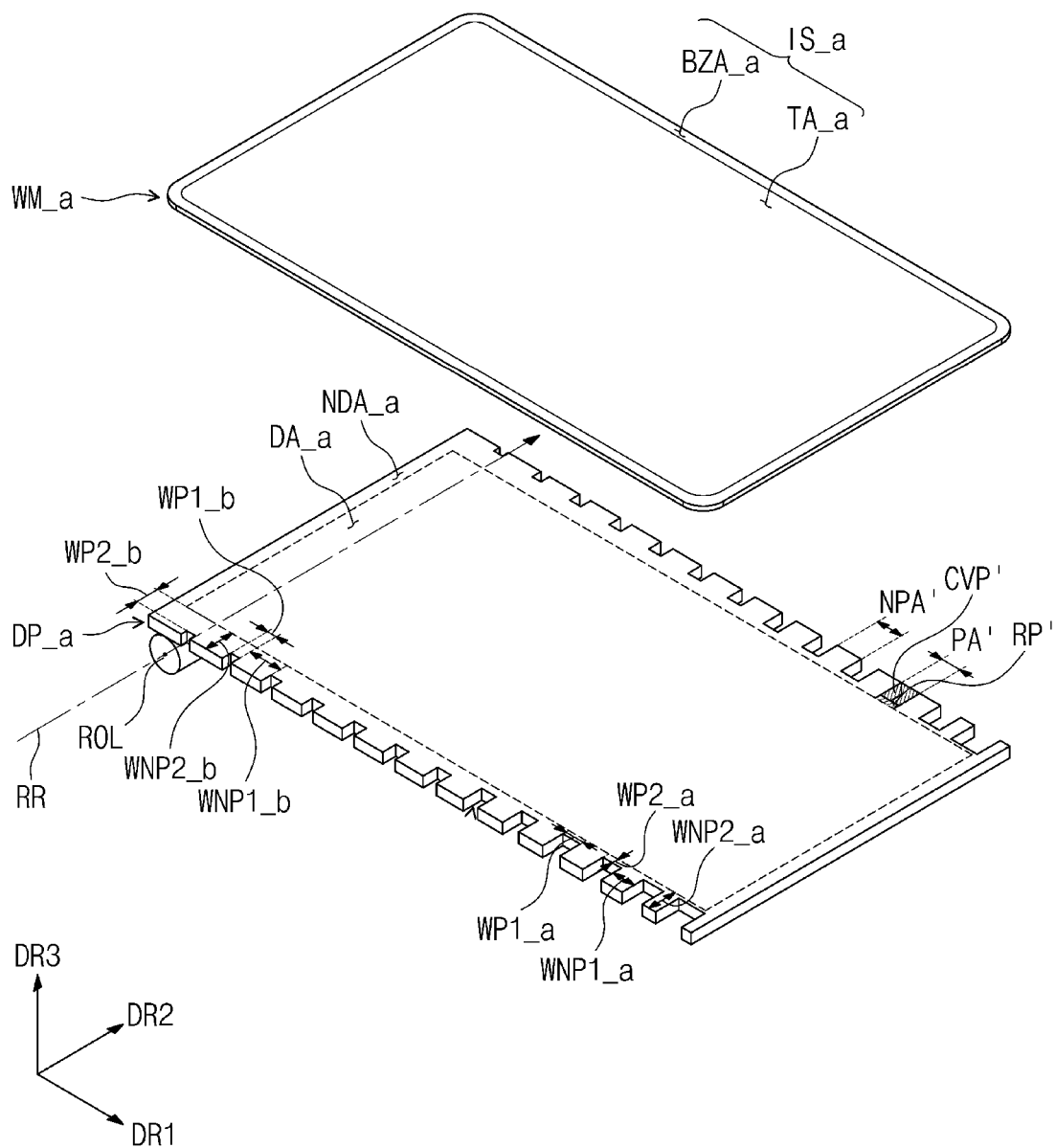
FIG. 10 is an exploded schematic perspective view of the pattern areas and non-pattern areas included in the display panel according to an embodiment.

FIG. 9 is a schematic perspective view of a display panel and the support layer when the display device illustrated in FIG. 7 is wound. FIG. 10 is an exploded schematic perspective view of the pattern areas and the non-pattern areas included in the display panel according to an embodiment.

The display panel DP_a and the support layer SUP_a are illustrated in FIG. 9. However, the disclosure is not limited thereto, and when the display device DD_a (refer to FIG. 7) includes an input sensing layer ISP_a, concave portions may be formed in the input sensing layer ISP_a.

The non-display area NDA_a of the display panel DP_a includes the pattern areas PA' and the non-pattern areas NPA' that are adjacent to the pattern areas PA'. Each pattern area PA' includes a concave portion CVP' and a remaining portion RP'. In an embodiment, the concave portion CVP' may be disposed between two adjacent non-pattern areas NPA'. The concave portion CVP' may be disposed in the non-display area NDA_a. The concave portion CVP' is not included in a display area DA_a.

Referring to FIGS. 9 and 10, the spacing (or distance) in the first direction DR1 between two non-pattern areas NPA' that are adjacent to each other may be defined as first pattern spacing $WP1\_a$ or $WP1\_b$. The first pattern spacing $WP1\_a$ or $WP1\_b$ may be equal to the width of a concave portion CVP' included in a pattern area PA' in the first direction DR1. The spacing (or distance) in the first direction DR1 between two support bars SSP_a that are adjacent to each other may be defined as support spacing WS_a.

In an embodiment, the first pattern spacing $WP1\_a$ or $WP1\_b$ may be equal to or smaller than the support spacing WS_a. Each support bar SSP_a may overlap a corresponding non-pattern area NPA'.

The spacing (or distance) in the first direction DR1 between two pattern areas PA' that are adjacent to each other may be defined as first non-pattern spacing $WNP1\_a$ or $WNP1\_b$. The first non-pattern spacing $WNP1\_a$ or $WNP1\_b$ may be equal to the width of a non-pattern area NPA' in the first direction DR1. The first non-pattern spacing $WNP1\_a$ or $WNP1\_b$ may be equal to or greater than the support spacing WS_a.

The width of the remaining portion RP' included in each of the pattern areas PA' in the second direction DR2 may be defined as second pattern spacing $WP2\_a$ or $WP2\_b$. The width of each of the non-pattern areas NPA' in the second direction DR2 may be defined as second non-pattern spacing $WNP2\_a$ or $WNP2\_b$. In an embodiment, the second pattern spacing $WP2\_a$ or $WP2\_b$ is smaller than the second non-pattern spacing $WNP2\_a$ or $WNP2\_b$.

In an embodiment, the first pattern spacing $WP1\_a$ or $WP1\_b$ may increase as the distance from the central axis RR increases. The first pattern spacing $WP1\_a$ or $WP1\_b$ includes the first sub-pattern spacing $WP1\_a$ and the second sub-pattern spacing $WP1\_b$. The first sub-pattern spacing $WP1\_a$ is a width in the first direction DR1 of a concave portion CVP' located at a relatively far distance from the central axis RR. The second sub-pattern spacing $WP1\_b$ is a width in the first direction DR1 of the concave portion CVP' located at a relatively close distance from the central axis RR. In an embodiment, the second sub-pattern spacing $WP1\_b$ may be smaller than the first sub-pattern spacing $WP1\_a$. In an embodiment, the second pattern spacing $WP2\_a$ or $WP2\_b$ may be decreased with an increase in the distance from the central axis RR. The second pattern spacing $WP2\_a$ or $WP2\_b$ includes the third sub-pattern spacing $WP2\_a$ and the fourth sub-pattern spacing $WP2\_b$. The third sub-pattern spacing $WP2\_a$ is a width in the second direction DR2 of a remaining portion RP' located at a relatively far distance from the central axis RR. The fourth sub-pattern spacing $WP2\_b$ is a width in the second direction DR2 of the remaining portion RP' located at a relatively close distance from the central axis RR. In an embodiment, the third sub-pattern spacing $WP2\_a$ may be smaller than the fourth sub-pattern spacing $WP2\_b$.

In an embodiment, the first non-pattern spacing $WNP1\_a$ or $WNP1\_b$ may decrease with an increase in the distance from the central axis RR. The first non-pattern spacing $WNP1\_a$ or $WNP1\_b$ includes the first sub non-pattern spacing $WNP1\_a$ and the second sub non-pattern spacing $WNP1\_b$. The first sub non-pattern spacing $WNP1\_a$ is a width (or distance) in the first direction DR1 between two pattern areas adjacent to each other located at a relatively far distance from the central axis RR. The second sub non-pattern spacing $WNP1\_b$ is a width in the first direction DR1 between two pattern areas adjacent to each other located at a relatively close distance from the central axis RR. In an embodiment, the first sub non-pattern spacing $WNP1\_a$ may be smaller than the second sub non-pattern spacing $WNP1\_b$. In an embodiment, the second non-pattern spacing $WNP2\_a$ or $WNP2\_b$ may be constant irrespective of the distance from the central axis RR. The second non-pattern spacing $WNP2\_a$ or $WNP2\_b$ includes the third sub non-pattern spacing $WNP2\_a$ and the fourth sub non-pattern spacing $WNP2\_b$. The third sub non-pattern spacing $WNP2\_a$ is a width in the second direction DR2 of a non-pattern area NPA' located at a relatively far distance from the central axis RR. The fourth sub non-pattern spacing $WNP2\_b$ is a width in the second direction DR2 of a non-pattern area NPA' located at a relatively close distance from the central axis RR. In an embodiment, the third sub non-pattern spacing $WNP2\_a$ may be equal to the fourth sub non-pattern spacing $WNP2\_b$.

When the display device DD_a (refer to FIG. 7) is wound about the central axis RR by the roller ROL, the magnitude of stress applied to the display panel DP_a may increase as the distance from the central axis RR increases. The size of the empty space between two adjacent non-pattern areas NPA' may be increased by increasing the size of a concave portion CVP' formed in the display panel DP_a as the distance from the central axis RR increases. Accordingly, strain applied to the display panel DP_a when the display panel DP_a is wound may be distributed, which prevents damage to the display panel DP_a and improves the reliability of the display panel DP_a.

Although only the display panel DP_a is illustrated in FIGS. 9 and 10, concave portions may be formed in the input sensing layer ISP_a when the display device DD_a includes the input sensing layer ISP_a. Furthermore, although a window WM_a having no concave portion is illustrated in FIG. 10, the disclosure is not limited thereto. In an embodiment, patterns identical or similar to concave portions may be formed in the window WM_a.

According to the disclosure, damage to a display panel may be prevented when the display panel is wound or bent.

While the disclosure has been described with reference to embodiments thereof, it will be apparent to those of ordinary skill in the art that various changes and modifications may be made thereto without departing from the spirit and scope of the disclosure as set forth in the following claims.

Accordingly, the scope of the disclosure should not be limited or determined by the described embodiments, and should be determined by the accompanying claims and the equivalents thereof.

What is claimed is:

1. A display device, comprising:
    a display module including:
        a display area that displays an image in a bending area and in a non-bending area, the bending area being bent when the display device performs a sliding motion and the non-bending area adjacent to the bending area not being bent during the sliding motion; and
        a non-display area disposed adjacent to the display area in the bending area and in the non-bending area, wherein the display module includes a display panel outputting the image and an input sensing layer disposed on the display panel; and
    a support layer disposed under the display panel, wherein the non-display area that is disposed in the bending area includes:
        pattern areas; and
        non-pattern areas disposed adjacent to the pattern areas, and
    each of the pattern areas includes:
        a concave portion provided in the display panel and the input sensing layer; and
        a remaining portion.

2. The display device of claim 1, wherein
    the flexible display device slides about a central axis parallel to a first direction, and
    a first width of the remaining portion in the first direction is smaller than or equal to a second width of the non-pattern areas in the first direction.

3. The display device of claim 2, wherein
    the support layer includes support bars extending in the first direction and spaced apart from each other in a second direction intersecting the first direction,
    each of the support bars overlaps corresponding one of the non-pattern areas, and
    the flexible display device slides in the second direction.

4. The display device of claim 3, wherein a distance in the second direction between two non-pattern areas adjacent to each other among the non-pattern areas is equal to or smaller than a distance in the second direction between two support bars adjacent to each other among the support bars.

5. The display device of claim 1, wherein the concave portion of at least one of the pattern areas includes a curved shape.

6. The display device of claim 1, wherein the concave portion of at least one of the pattern areas includes a polygonal shape.

7. The display device of claim 1, wherein the concave portion of at least one of the pattern areas is disposed only in the non-display area that is disposed in the bending area.

8. The display device of claim 1, further comprising:
    a window disposed over the display module.

9. The display device of claim 8, wherein
    the window includes:
        a light transmitting area corresponding to the display area that is disposed in the bending area and in the non-bending area; and
        a bezel area corresponding to the non-display area that is disposed in the bending area and in the non-bending area, and
    the bezel area overlaps the concave portion of at least one of the pattern areas.

10. The display device of claim 8, wherein
    the window includes:
        a light transmitting area corresponding to the display area that is disposed in the bending area and in the non-bending area; and
        a bezel area corresponding to the non-display area that is disposed in the bending area and in the non-bending area, and
    the bezel area does not overlap the concave portion of at least one of the pattern areas.

11. The display device of claim 8, wherein
    the pattern areas are not formed in the window, and
    a bezel area of the window overlaps the concave portion.

12. The display device of claim 8, wherein
    the concave portion is formed in the window, and
    a bezel area of the window does not overlap the concave portion.

* * * * *